(12) United States Patent
Anderson et al.

(10) Patent No.: US 6,407,553 B1
(45) Date of Patent: Jun. 18, 2002

(54) STRAIN GAGES FOR DETERMINING CHARGE OF A BATTERY HAVING A THIN WALLED PRESSURE VESSEL

(75) Inventors: Duane Selwyn Anderson, Gilroy; Jon David Armantrout, Mt. View; Gregor Jon Cuzner, San Jose, all of CA (US)

(73) Assignee: Lockhead Martin Corporation, Sunnyvale, CA (US)

( * ) Notice: Subject to any disclaimer, the term of this patent is extended or adjusted under 35 U.S.C. 154(b) by 0 days.

(21) Appl. No.: 09/456,541

(22) Filed: Dec. 8, 1999

(51) Int. Cl.[7] ............ G01N 27/02; G01N 27/416; G01L 9/04; H01M 10/48
(52) U.S. Cl. ............ 324/443; 324/427; 73/720; 73/726; 429/90
(58) Field of Search ............ 324/443, 71.1, 324/456, 427; 320/147; 73/862.627, 720, 726; 429/90, 91

(56) References Cited

U.S. PATENT DOCUMENTS 3,614,583 A * 10/1971 Burkett ............ 320/129
4,794,797 A *  1/1989 Ogawa ............ 324/456

* cited by examiner

*Primary Examiner*—N. Le
*Assistant Examiner*—Anjan K. Deb
(74) *Attorney, Agent, or Firm*—Swidler Berlin Shereff Friedman, LLP

(57) ABSTRACT

A strain gage system for determining state of charge in a battery having a pressure vessel includes a strain gage bridge system mounted on a first cylindrical portion of the pressure vessel. The bridge system has a plurality of active strain gages and no inactive or dummy gages. An electrical output of the strain gage bridge is correlated to a state of charge of the battery.

14 Claims, 6 Drawing Sheets

STRAIN GAGES FOR DETERMINING CHARGE OF A BATTERY HAVING A THIN WALLED PRESSURE VESSEL

BACKGROUND OF THE INVENTION

The present invention relates generally to the field of electric batteries, and more specifically, to determining charge levels in a battery having a thin walled pressure vessel. These types of batteries are used in low earth orbit (LEO) spacecraft or satellites. Strain gages are installed on the pressure vessels, using adhesives, at predetermined locations and provide an output that varies in accordance with battery charge.

DESCRIPTION OF THE RELATED ART

A spacecraft orbiting the earth requires energy storage batteries to power system loads when the orbital path is in the shadow of the earth. In sunlight, solar arrays power system loads and recharge the batteries. A typical orbit time for a spacecraft in a low earth orbit is 90 minutes, with about two-thirds of the time in sunlight and one-third in shadow. This works out to approximately 5,800 cycles per year.

By way of example, FIG. 1 schematically illustrates a satellite 10 and one of its battery bays 12, and showing exposure to the sun 14. On the HST satellite, the bay 12 contained three batteries; all batteries carried by the satellite were nickel-cadmium (NiCd), but subsequently, $NiH_2$ cells and batteries were developed to extend operational life.

It is desirable to have batteries fully charged for maximum available reserve power; however, any overcharge is dissipated as heat. Excess heat upsets the thermal balance of the spacecraft, puts extra loading on the thermal radiators, and causes the batteries to heat, all of which is undesirable. The batteries are initially efficient and generate very little heat during charging to about 90% of full capacity.

Methods used to control charging of the batteries include time-rate ampere hour integration control and/or battery voltage sensing to maintain state-of-charge of the battery. An on-board computer can be used to control the charge rate and cut off to prevent overcharge. This arrangement has worked well, except when the computer malfunctions, requiring it to be reset and re-initialized. One of the features of the $NiH_2$ battery is a relatively flat discharge voltage profile over a large range of capacity. This requires an estimate of the state-of-charge to be loaded into the computer to regain charge control.

The Hubble Space Telescope was the first LEO application for a $NiH_2$ battery system, and it has operated successfully since launch in 1990. The Hubble Space Telescope spacecraft has six (6) eighty-eight (88) ampere-hour batteries, which were manufactured by Eagle Picher Technologies, LLC. Reasons for choosing the $NiH_2$ batteries include lower weight (the $NiH_2$ batteries weight 120 pounds, versus about 180 pounds for the NiCd batteries) and a projected life of twelve (12) years versus three (3) to four (4) years for the NiCd batteries.

The $NiH_2$ cell generates hydrogen gas and, as it charges in the closed container, the amount of gas is proportional to the amount of charge in the cell. The internal pressure of a battery cell varies from about fifteen (15) psia at full discharge to over 1,000 psia at full charge. This can provide a convenient way to determine actual state-of-charge of the cell similar to that of a fuel gauge on a car. Moreover, it is not dependent on time-rate integration of the computer and can be used for charge control and cut-off Referring to FIG. 2, each battery cell container 16 is a thin-walled shell made of a strong metallic material, such as INCONEL having a wall thickness of approximately 0.030 to 0.040 inches, in the form of a pressure vessel having a diameter of 3.5 inches and an overall length of about 10.5 inches. Each container 16 has a cylindrical medial portion 18 and two opposite axial dome shaped end portions 20 and 22, having hemispherical shapes, which are integrally formed with the cylindrical portion 18.

Strain gauges have been used in the past on battery cells to measure state-of-charge. They provide an attractive, non-intrusive, non-invasive method for the measurement of cell pressure, and thus, state-of-charge. Two or more cells in each battery have strain gauges installed as a primary and back up state-of-charge indicators. Referring to FIG. 3, a strain gauge system used on the Hubble Space Telescope installations is shown as a top view of one of the domed ends of the container 16. The illustration is of a full bridge configuration with two active legs or strain gauges 24 and 26 installed on the domed-shaped end 22 of the cell. Two inactive strain gauges 28 and 30 are installed on an unstrained metal coupon 32 (cut from another dome section) and bonded to the domed end 22 near the active strain gauges 24 and 26 with an adhesive, such as RTV 566. A multi-layer flexible circuit 34 is used with soldered wire jumpers to interconect the gauges. The system includes a bridge balance resistor 36.

The gauges are Micromeasurements model CEA-06-250-350, constantan grid, encapsulated in a polyimide envelope, which are installed with M-bond 610 adhesive.

The completed cell with gauge installation is then coated with "Conathane" that serves as an insulator and a protective coating. A retrofit of strain gauges on completed cells required an adhesive with a much lower cure temperature than required for the 610 adhesive. M-bond AE15 was found to be suitable. This adhesive was also used by Gates Aerospace with type WK gauges for installation on their space flight cells.

A complete battery assembly with strain gauge bridges on two cells, substantially of the construction described above, was installed in a vacuum chamber for a thermal/vacuum test. The battery was charged and discharged at different stabilized temperatures. Strain gauges were monitored and recorded during the test in order to study power dissipation from the strain gauges in addition to the thermal performance characteristics of the battery. During testing, temperature changes when the battery was not operated, i.e., in steady-state, the indicated pressure shift from the strain gauges was not as predicted due to test temperature changes. In fact, readings changed by a larger amount and in the opposite direction.

It was determined that there was insufficient test data to establish any thermal zero shift for the strain gauge bridges, and there were no tests run in a vacuum chamber for production "end item" batteries. In a vacuum chamber, to simulate the condition of use, the transfer path is much different than atmospheric conditions. Half of the heat dissipated from the strain gauge bridge circuit is on the metal coupon.

In a vacuum, no convection transfer takes place, radiation transfer is minimal and the heat from the coupon must conduct through the attachment to the cell, through the cell to support thermal sleeve and to the base plate. The thermal test showed that the cells with strain gauges were a few degrees warmer than cells without gauges. The corollary of this is that the coupon with the two compensation gauges must be a few degrees warmer than the cell to transfer the heat to the cell, and therefore, any temperature related effects on the zero reference, including thermoelectric effects, are increased. Thus, the larger the excitation, the greater the dissipation and the greater the zero shift problem. Fabricators of other $NiH_2$ cells use a similar bridge installation with two inactive (compensation) gauges on a coupon. Although the selected gauges and adhesives vary, most applications may experience similar zero shifts under actual conditions of use.

End item users would prefer an accuracy within +/−15% FSO or better for the measurement. Estimated error for existing systems can be as high as +/−15%. Cycle to cycle repeatability is fairly good, although it can drift with temperature. The on-board calibration to verify system/amplifier/excitation integrity is not included. The only way users can gain some confidence and re-establish a baseline is to perform a complete capacity check, where the battery is discharged through a resistor to a very low terminal voltage (almost zero capacity) and then recharged, which can take several orbital cycles, to achieve full charge.

Unfortunately, the amplifier circuit uses a single power supply which will not allow it to read zero, and it saturates at about +0.5 volts of the 5.0 volt output range. The actual measurement zero is not offset to allow it to remain in the readable range near zero state of charge.

Strain gauges were installed in a similar manner, two active gauges on the dome, two inactive gauges on a coupon attached to the dome, on a different cell that was used in a controlled calorimeter test. One extra bridge with four active gauges was added to the cylindrical part of the cell, to be monitored during the test. The tests involved slow charge and discharge cycles at controlled temperatures. Test results, shown in FIG. 4 at 0° C. and at 10° C., indicated constant slope bridge output with very good repeatability from the traditional bridge when the data was typically "normalized," meaning zeroed at the start of the test. The indicated pressure was calculated since there was no way to calibrate the completed cell with pressure.

As seen in FIG. 5, when the absolute value of the bridge output was used, the zero shift was much larger than expected. The zero shift with temperature appeared to be the biggest problem that need resolution.

SUMMARY OF THE INVENTION

An object of the present invention is to provide a strain gage system that is capable of accurately measuring charge in a battery by correlating internal pressure to the state of charge.

Another object of the invention is to provide a strain gage system that minimizes temperature zero shift.

Still another object of the present invention is to provide a strain gage system that uses less energy and thus produces less heat that would otherwise tend to distort readings.

Yet another object of the present invention is to provide a strain gage bridge that produces larger output, which allows a reduction of the excitation to the bridge, which in turn decreases the power requirements and reduces the overall heat dissipation.

These and other objects of the invention are met by providing a strain gage system for determining state of charge in a battery, which includes a four active strain gage bridge system mounted on a first cylindrical portion of a pressure vessel, and means for correlating an electrical property of the strain gage bridge to a state of charge.

These and other objects of the invention will become more apparent from the following detailed description when taken in conjunction with the illustrative embodiments in the accompanying drawings.

DETAILED DESCRIPTION OF THE PREFERRED EMBODIMENTS

Figure 1:
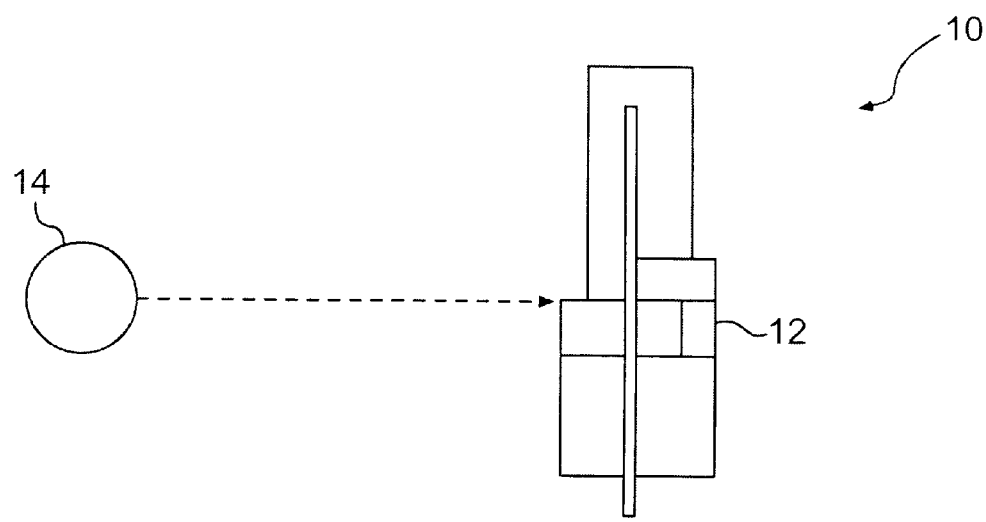
FIG. 1 is a schematic view of a spacecraft capable of utilizing batteries that employ the strain gage system of the present invention.
Figure 2:
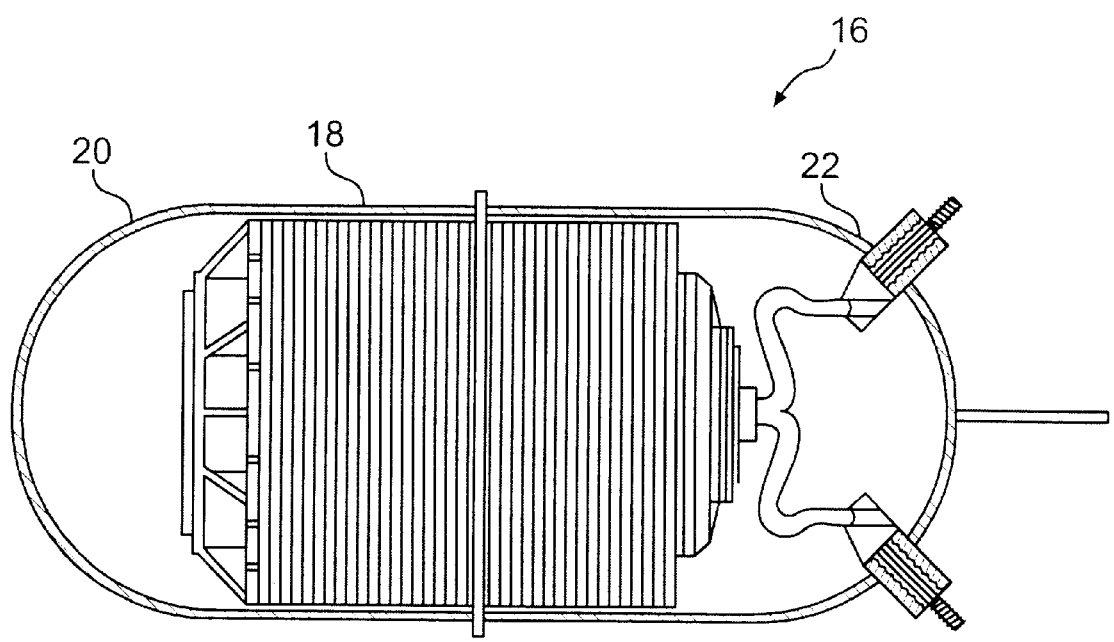
FIG. 2 is a vertical, sectional view of a battery to which the strain gage system of the present invention can be applied.
Figure 3:
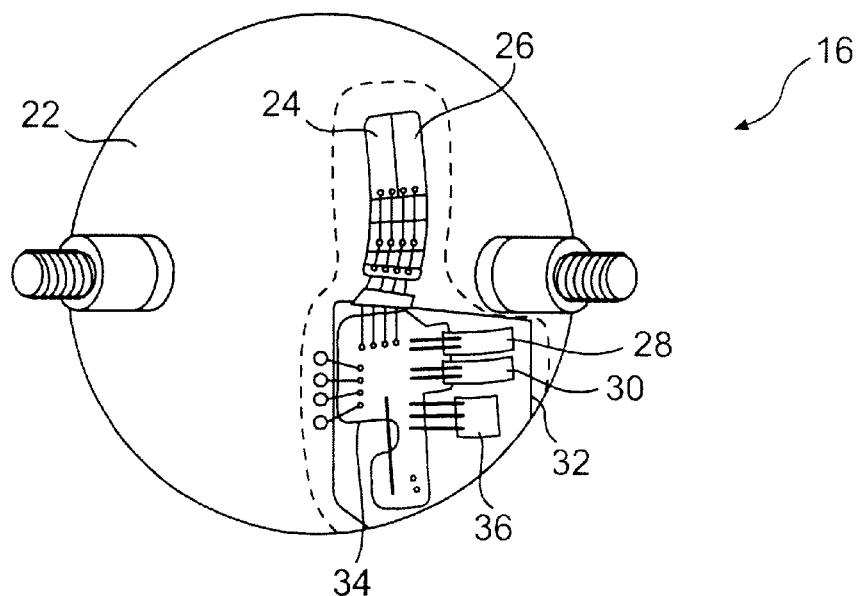
FIG. 3 is a top view of the battery of FIG. 2, with a strain gage system applied to one of the dome-shaped ends of the battery container.
Figure 4:
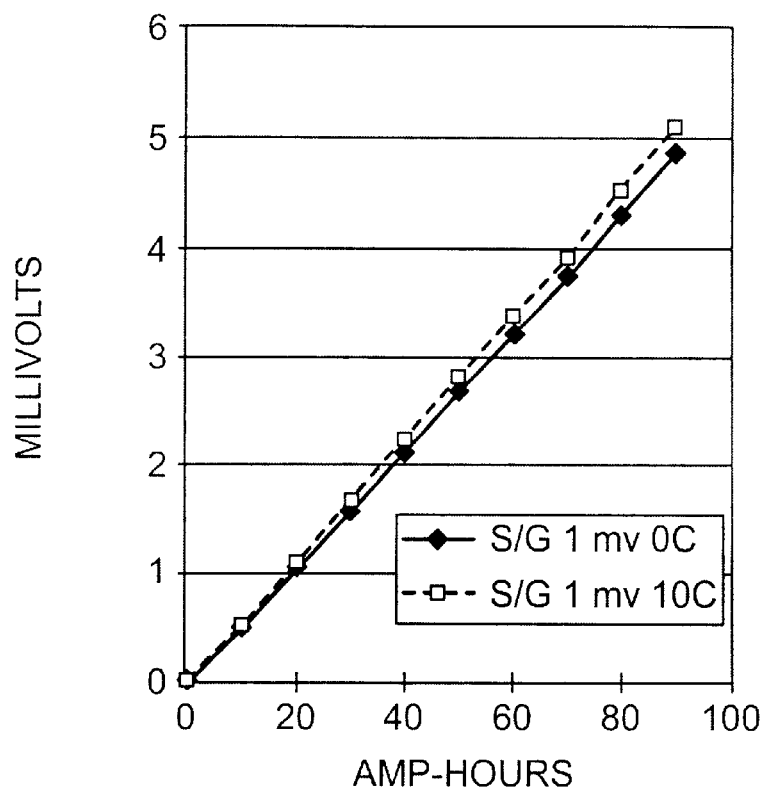
FIG. 4 is a graph showing millivolts verses amp hours of charge, tested at 0° C. and 10° C., showing constant slope bridge output with very good repeatability from a bridge constructed on a dome-shaped portion of the battery container, with the results showing data normalized.
Figure 5:
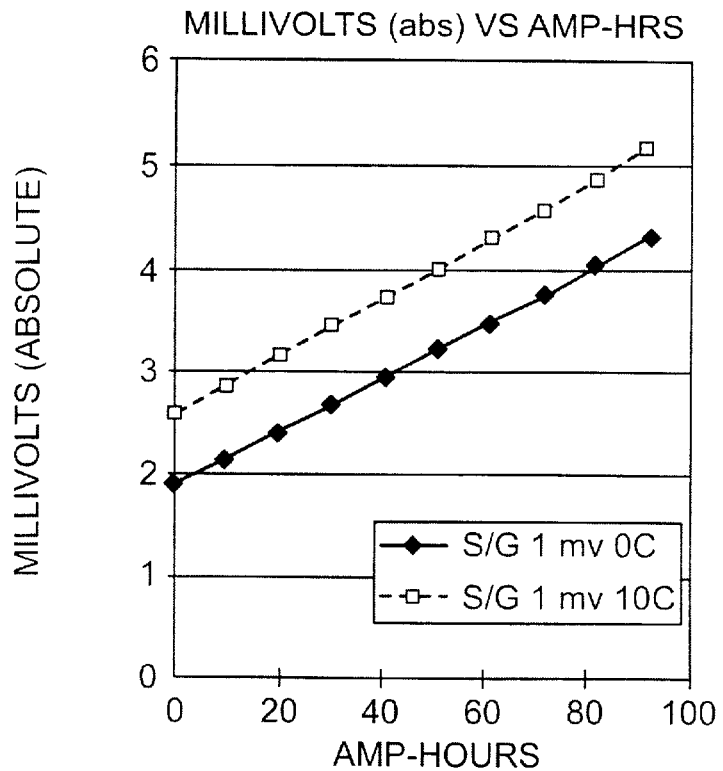
FIG. 5 is a graph similar to FIG. 4, but showing the absolute value of the bridge output, and showing that the zero shift is pronounced.
Figure 6:
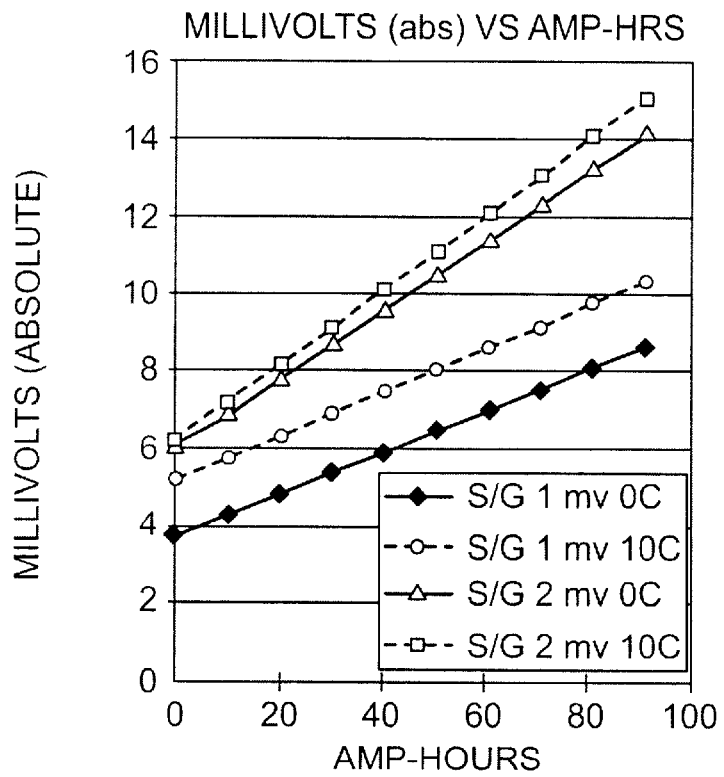
FIG. 6 is a graph showing the combined data of a dome-mounted bridge and a four-active gage bridge installed on the cylindrical portion of the battery container.

As noted above, the coupon did not provide the required temperature compensation; however, results shown in FIG. 6, in which an four-active gage bridge was installed on the cylindrical portion of the container, with all four gages in tension, show an improvement in results. This approach has been found to minimize the temperature zero shift problem, and basically relies on the 2 to 1 ratio of stresses on the cylindrical portion of the pressure vessel. As stated above, FIG. 6 shows the results of the added bridge to the calorimeter tests were added to the previous graph, FIG. 5.

Figure 7:
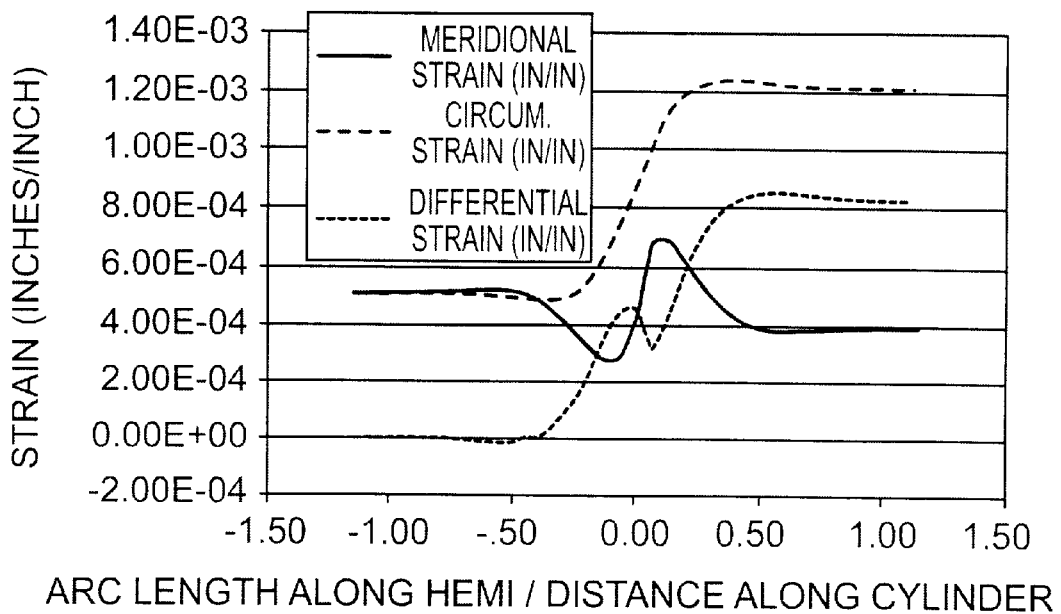
FIG. 7 is a graph of a computer-generated prediction of the stress field at the zone of transition between the cylindrical portion of the container and the hemispherical portion.

The results show practically no zero shift, and the larger output allows a reduction of the excitation to the bridge which decreases the power and reduces the overall heat dissipation. It was uncertain what the stress/strain field would look like where the 1 to 1 relationship of the hemispherical section met the 2 to 1 relationship in the cylindrical section (where hoop stress is twice the longitudinal). A computer generated prediction of the stress field at this transition zone is shown in FIG. 7. The plots show that the installed bridge was just far enough down the cylinder to be outside the transition region.

Figure 8:
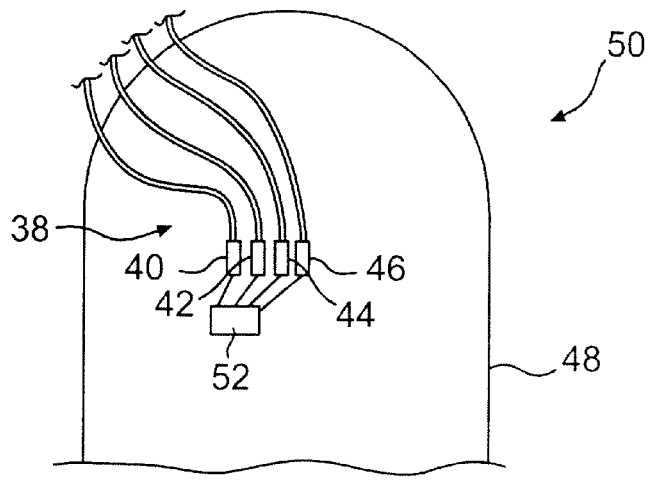
FIG. 8 a side elevational view of a portion of a battery container or pressure vessel, showing a four-active strain gage bridge system according to the present invention.

In a preferred embodiment of the present invention, and with reference to FIG. 8, a four-active strain gage bridge system 38 includes four active strain gages 40, 42, 44, 46 mounted on the container 48 of a battery 50, and a bridge balance resistor 52. The container 48 can be made of metal alloys, such as INCONEL. The active strain gages can be CEA-06-125UT-350 gages, and the bridge balance resistor can be a E01-00180 bridge balance resistor. All were installed using AE15 adhesive, cured, post-cured, and protected coated with AE15. Excitation power was supplied at five (5) volts to reduce the heat dissipation of the bridge by a factor of four and be able to use smaller gages. A second bridge system, identical to the first one, can be installed as a backup. If the backup is installed, both are installed at the same time, in one installation and cure cycle.

Figure 9:
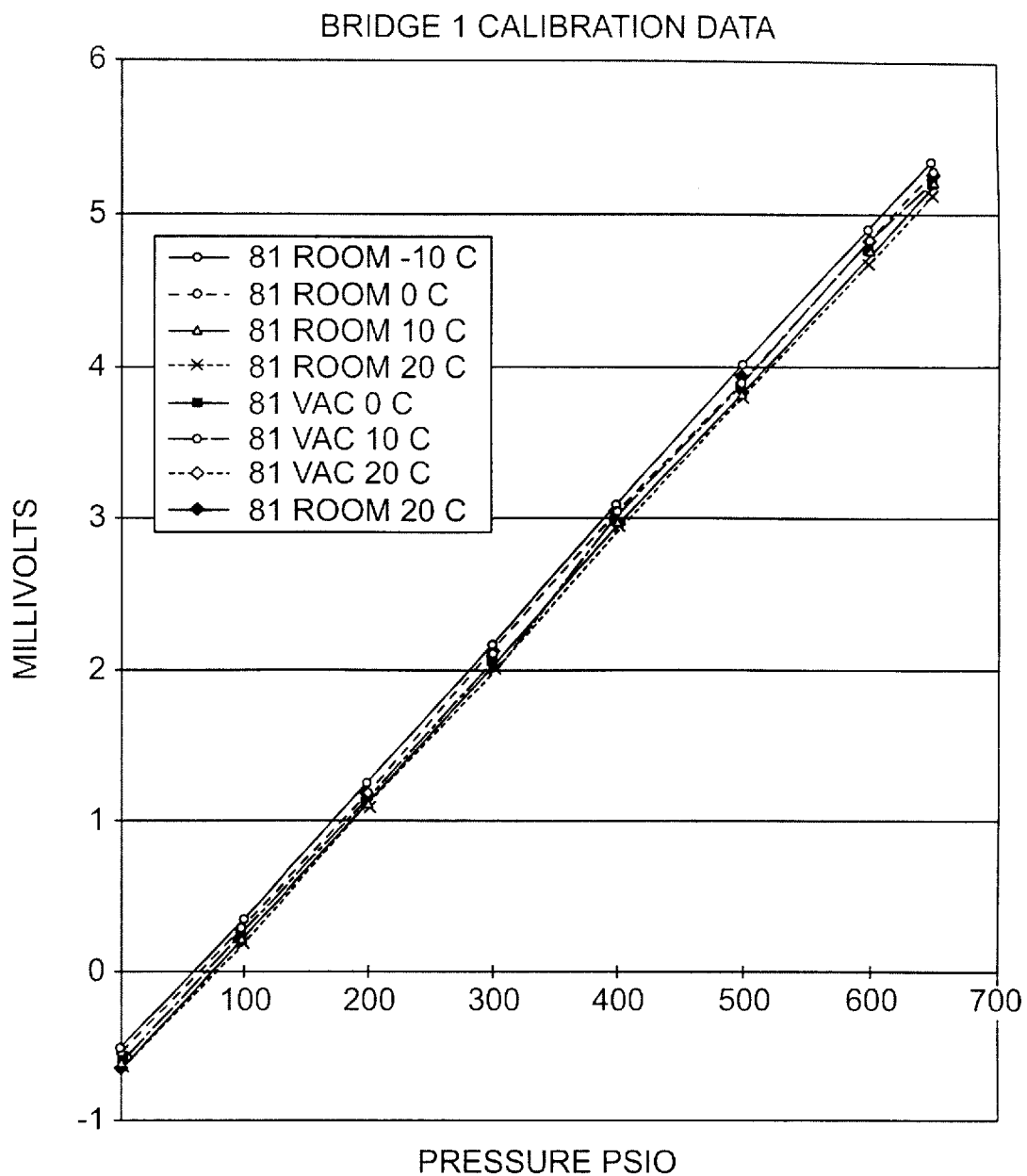
FIGS. 9 and 10 are graphs showing test results for a primary bridge system and backup system using the arrangement shown in FIG. 8.
Figure 10:
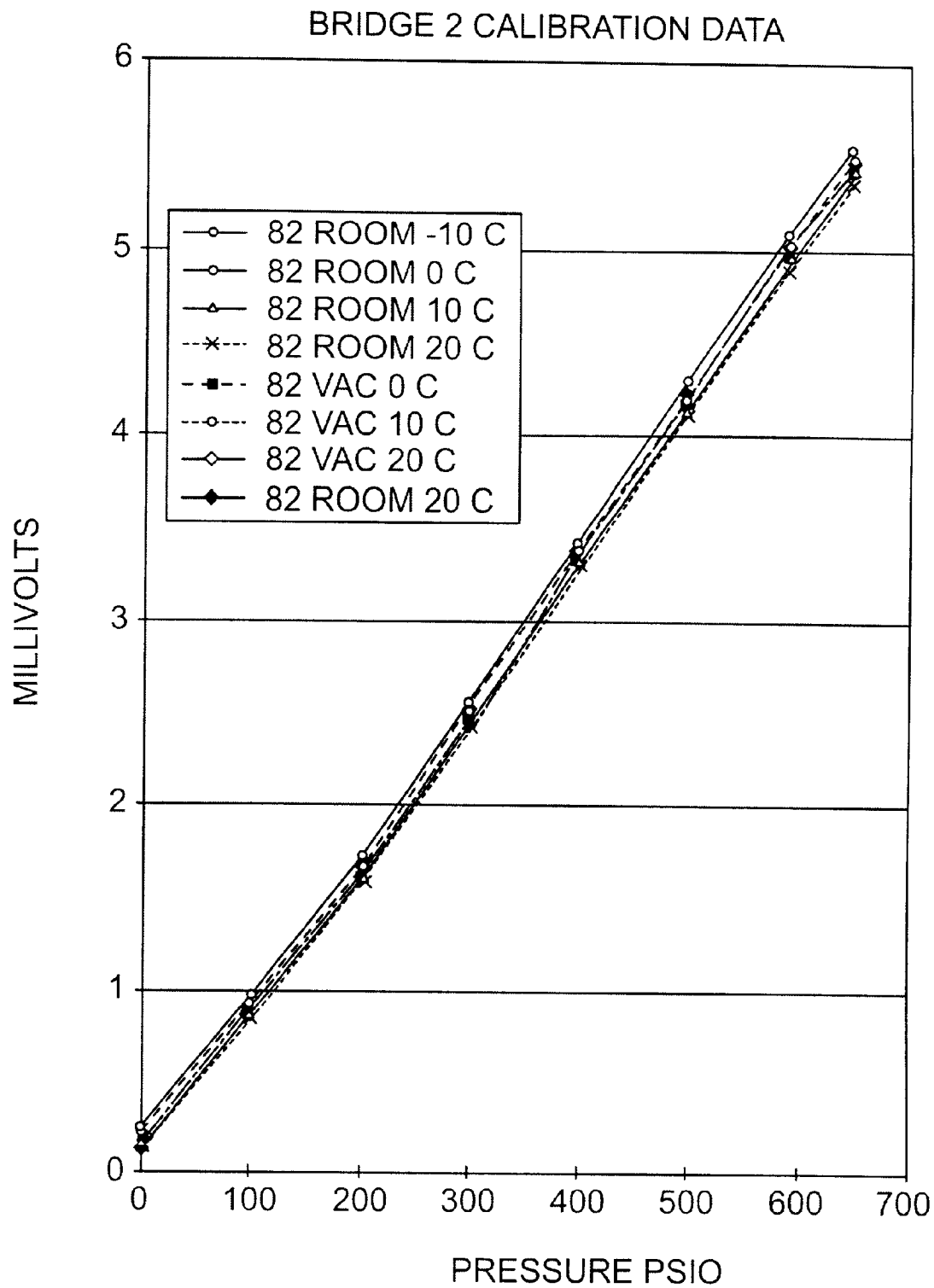

The embodiment described above was tested by pressure cycling the pressure vessel from 0 to 650 psig several times, at temperatures of 0° C., 10° C., and 20° C. Test results for a primary bridge system and backup system are shown in FIGS. 9 and 10, respectively. Performance was within +/−5% of full range error band of the original calibration (for each bridge) for all conditions of the testing.

Cell strain gage bridge installations that use all four gages active for measurements on thin walled pressure vessels (or tubing) exhibit very good temperature compensation, have higher output, and are easier and much less expensive to install, compared to use of a separate coupon for temperature compensation gages.

According to the preferred embodiment, the active strain gages should be located on the cylindrical portion of the pressure vessel just below, or outside of, the transition zone of stresses, which occurs at the area where the cylindrical portion meets the hemispherical portion of the pressure vessel.

Although four active strain gages were described and illustrated above, a different number could also be employed, so long as they are located on the cylindrical portion of the container.

Moreover, any conventional means can be used to correlate an electrical property of the strain gage bridge system, such as electrical resistance, to a state of charge of the battery. In spacecraft, the resistance value can be digitized by on-board computers and broadcast to a ground station. For terrestrial applications, the wiring of the strain gage bridge system can be fed to an appropriate analog or digital instrument to provide a charge condition in a cognizable format, such as a meter.

Although the invention has been described with reference to a particular embodiment, it will be understood to those skilled in the art that the invention is capable of a variety of alternative embodiments within the spirit and scope of the appended claims.

What is claimed is:

1. A method of determining state of charge in a battery having a pressure vessel whose internal pressure varies in accordance with the state of charge of the battery, comprising the steps of
   mounting a strain gage bridge system on a first cylindrical portion of the pressure vessel; and
   correlating an electrical property of the strain gage bridge to a state of charge of the battery.

2. A method according to claim 1, wherein the battery is a nickel-hydrogen battery which generates hydrogen gas as it charges.

3. A method according to claim 1, wherein the strain gage bridge includes four active gages and a bridge balance resistor.

4. A method according to claim 3, wherein the four active gages are mounted just below a stress field transition region corresponding to where the cylindrical portion of the pressure vessel meets a second portion having a different geometry.

5. A method according to claim 4, wherein the second portion is dome-shaped.

6. A method according to claim 1, wherein the electrical property is resistance.

7. A method according to claim 1, wherein the four active strain gages are adhesively bonded to the pressure vessel.

8. A strain gage system for determining state of charge in a battery having a pressure vessel, comprising:
   a strain gage bridge system mounted on a first cylindrical portion of the pressure vessel, and having a plurality of active strain gages and no inactive or dummy gages; and
   means for correlating an electrical property of the strain gage bridge to a state of charge of the battery.

9. A strain gage system according to claim 8, wherein the battery is a nickel-hydrogen battery which generates hydrogen gas as it charges.

10. A strain gage system according to claim 8, wherein the strain gage bridge includes four active gages and a bridge balance resistor.

11. A strain gage system according to claim 10, wherein the four active gages are mounted just below a stress field transition region corresponding to where the cylindrical portion of the pressure vessel meets a second portion having a different geometry.

12. A strain gage system according to claim 11, wherein the second portion is dome-shaped.

13. A strain gage system according to claim 8, wherein the electrical property is resistance.

14. A strain gage system according to claim 8, wherein the four active strain gages are adhesively bonded to the pressure vessel.

* * * * *

UNITED STATES PATENT AND TRADEMARK OFFICE
CERTIFICATE OF CORRECTION

PATENT NO.    : 6,407,553 B1
DATED         : June 18, 2002
INVENTOR(S)   : Duane Selwyn Anderson et al.

It is certified that error appears in the above-identified patent and that said Letters Patent is hereby corrected as shown below:

<u>Title page,</u>
Item [73], Assignee, should read:
-- [73]   Assignee:   Lockheed Martin Corporation, Sunnyvale, CA (US) --

Signed and Sealed this

First Day of April, 2003

JAMES E. ROGAN
*Director of the United States Patent and Trademark Office*